(12) United States Patent
Montanini et al.

(10) Patent No.: US 8,987,827 B2
(45) Date of Patent: Mar. 24, 2015

(54) PREVENTION OF FACETING IN EPITAXIAL SOURCE DRAIN TRANSISTORS

(71) Applicants: STMicroelectronics, Inc., Coppell, TX (US); International Business Machines Corporation, Armonk, NY (US); GLOBALFOUNDRIES Inc., Grand Cayman (KY)

(72) Inventors: Pietro Montanini, Albany, NY (US); Raymond Joy, Mechanicville, NY (US); Marta Mottura, Albany, NY (US); Henry K. Utomo, Newburgh, NY (US)

(73) Assignees: STMicroelectronics, Inc., Coppell, TX (US); International Business Machines Corporation, Armonk, NY (US); GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/907,690

(22) Filed: May 31, 2013

(65) Prior Publication Data

US 2014/0353741 A1    Dec. 4, 2014

(51) Int. Cl.
*H01L 29/66* (2006.01)
*H01L 29/78* (2006.01)

(52) U.S. Cl.
CPC ...... *H01L 29/66636* (2013.01); *H01L 29/7848* (2013.01)
USPC ............................ 257/369; 438/197; 438/585

(58) Field of Classification Search
CPC ...................... H01L 29/66636; H01L 29/7848
USPC .................................. 438/197, 585; 257/369
See application file for complete search history.

(56) References Cited

U.S. PATENT DOCUMENTS

| 7,358,551 B2 * | 4/2008 | Chidambarrao et al. ...... 257/288 |
| 2008/0003789 A1 * | 1/2008 | Chen et al. .................... 438/585 |

* cited by examiner

*Primary Examiner* — Roy Potter
*Assistant Examiner* — Paul Patton
(74) *Attorney, Agent, or Firm* — Seed IP Law Group PLLC (57) ABSTRACT

A method for fabricating enhanced-mobility pFET devices having channel lengths below 50 nm. Gates for pFETs may be patterned in dense arrays on a semiconductor substrate that includes shallow trench isolation (STI) structures. Partially-enclosed voids in the semiconductor substrate may be formed at source and drain regions for the gates, and subsequently filled with epitaxially-grown semiconductor that compressively stresses channel regions below the gates. Some of the gates (dummy gates) may extend over edges of the STI structures to prevent undesirable faceting of the epitaxial material in the source and drain regions.

44 Claims, 5 Drawing Sheets

PREVENTION OF FACETING IN EPITAXIAL SOURCE DRAIN TRANSISTORS

BACKGROUND

1. Technical Field

The technology relates to methods and structures for making enhanced-mobility field-effect transistors having sub-50-nanometer channel lengths. More particularly, the technology relates to controlling epitaxial growth in source an drain regions, so as to prevent faceting at undesirable locations.

2. Discussion of Related Art

Transistors are fundamental device elements of modern digital processors and memory devices. Currently, there are a variety of transistor designs or types that may be used for different applications. Various transistor types include, for example, bipolar junction transitors (BJT), junction field-effect transistors (JFET), metal-oxide-semiconductor field-effect transistors (MOSFET), vertical channel or trench field-effect transistors, and superjunction or multi-drain transistors. As is widely known, the size of transistors' active areas continue to reduce with each new generation of micro- and nano-fabricated devices, and this reduction can be characterized according to Moore's law. The reduction in transistor dimensions has presented and continues to pose various fabrication challenges as transistor channel dimensions have reduced below 250 nanometers (nm).

Figure 1:
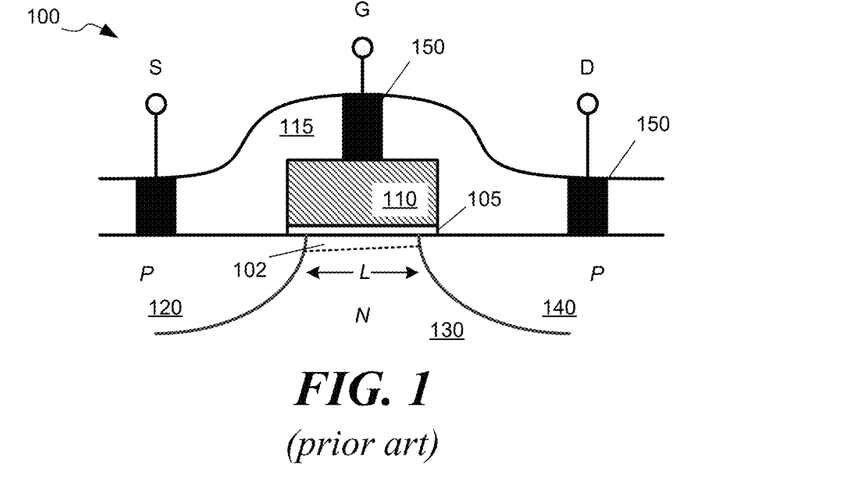
FIG. 1 depicts an elevation view of a FET formed on a substrate.

An example of a pFET 100 is depicted in the elevation view of FIG. 1. The pFET may be formed at a small region on a semiconductor substrate, and may comprise a source region 120, a body region 130, and a drain region 140. The source and drain regions may be doped to be of a first conductivity type (P), whereas the body region 130 may be doped to be of a second conductivity type (N). The source and drain regions may be formed by ion implantation and diffusion. Adjacent the body region and at the surface of the substrate may be a gate 110 formed of a conductive material (e.g., a metal, a highly doped semiconductor, polycrystalline or amorphous silicon, etc.). The gate 110 may be electrically insulated from the body, source, and drain regions by a thin insulating layer 105 (e.g., a thin oxide, a thin dielectric). The source, gate and drain may be covered by a passivation layer 115, such as an oxide or hard baked polymer. Holes or vias may be opened in the passivation layer 115 so that conductive contacts 150 can be formed to contact the source, gate, and drain terminals of the FET. Biasing the gate 110 at an appropriate voltage (typically less than or equal to 0 volts for a pFET), draws minority carriers (holes for the pFET) from the body region 130 to form an inversion layer, or channel 102, having a length L below the gate. The channel permits current flow between the source and drain regions. In fabricating a semiconductor chip, up to hundreds of thousands of FETs like that shown in FIG. 1 may be formed on a single chip.

SUMMARY

The described technology relates to methods and structures for making enhanced mobility pFETs in dense arrays having channel dimensions less than 50 nm. Epitaxial growth of doped semiconductor material may be used to form source and drain regions in the devices. The epitaxially-grown material may compressively stress the semiconductor in the channel region and thereby enhance the mobility of carriers in the channel. Faceting of the epitaxial layer at undesirable locations in the source and drain regions can be prevented by constraining the epitaxial growth within bottle-like structures at the source and drain regions. The controlled, or bottled, epitaxial growth can lead to higher device yield.

According to some embodiments, a structure of a mobility-enhanced pFET device comprises an insulated gate on a substrate. The gate may be arranged such that a channel forms near an interface between the insulated gate and substrate. The substrate may be any suitable semiconductor substrate having a first conductivity type. The structure further includes a first region filled with epitaxially-grown material on a first side of the insulated gate and a second region filled with the epitaxially-grown material on a second side of the insulated gate. The epitaxially-grown material may have a second conductivity type and may be a same or different semiconductor material. The structure may further include a trench isolation structure adjacent the first region, and the first region filled with epitaxially-grown material may extend from below a level of the channel of the pFET to at least the channel level. At the level of the channel, the first region filled with epitaxially-grown material may extend from the trench isolation structure to the insulated gate. The channel length of the device may be about 30 nm.

Processes for fabricating a mobility-enhanced pFET device include forming a partially-enclosed void in a substrate adjacent a channel region of the pFET. The partially-enclosed void may have an opening at approximately a level of the channel region, and the opening may have a width that is less than a maximum transverse dimension of the partially-enclosed void. A process may further include epitaxially growing semiconductor material in the partially-enclosed void to substantially fill the void. In some embodiments, the epitaxially-grown material may over-fill the void.

In some embodiments, a method for epitaxially filling a void in a semiconductor substrate comprises forming the void as a partially-enclosed void that has a constricted opening to the void. The opening to the void may have a width less than a maximum transverse dimension of the void. The method may further include epitaxially growing material in the void to fill the void to at least the opening. The interior surface of the void may have no significant inward projections from which faceting of the epitaxially-grown material would occur.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

The features and advantages of the embodiments will become more apparent from the detailed description set forth below when taken in conjunction with the drawings.

DETAILED DESCRIPTION

Figure 2A:
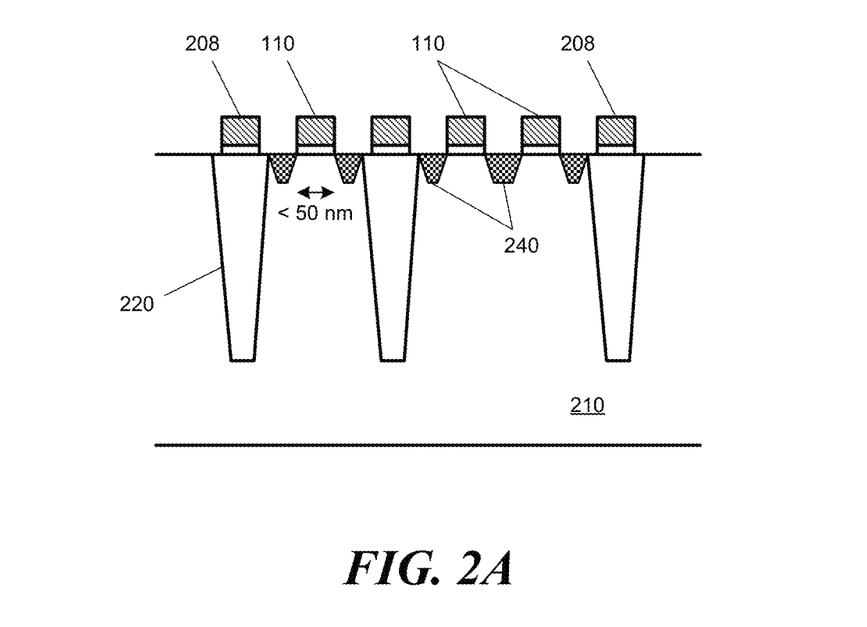
FIG. 2A depicts enhanced-mobility FETs formed on a substrate, according to one embodiment.

An embodiment of enhanced-mobility pFETs in a dense array having channel lengths less than approximately 50 nm is depicted in FIG. 2A. The structure shown is for teaching purposes only, and the number and arrangement of pFETs may be different than shown in the drawing. For simplicity, the drawing omits the passivation layer 115 and contacts 150 shown in FIG. 1.

According to some embodiments, isolation structures 220 may be formed in the substrate 210 to electrically isolate one or more pFET devices. These electrically-insulating structures may be formed using shallow-trench isolation (STI) techniques. One or more pFETs may include a gate 110 over an insulating layer, and epitaxially-grown material 240 for source and drain regions. There may also exist one or more dummy gates 208, of the same structure as gates 110, but that are not functioning transistors.

One technique for improving the performance of a FET is to enhance the mobility of carriers in the device. To enhance the mobility of carriers (holes) in the channel of a pFET, the material in which the channel is formed may be placed under compressive stress. For the structure shown in FIG. 2A, the epitaxially-grown material 240 may be selected such that it places the body material in the region of the channel below the gate 110 under compressive stress. Trenches may be formed in the source and drain regions in which the source and drain material may be epitaxially grown. The epitaxially-grown material may be selected based upon a mismatch in lattice constant with the substrate.

For example, if the substrate 210 comprises a bulk silicon (Si) substrate, the epitaxially-grown material may be selected to be silicon-germanium (SiGe). The lattice constant for SiGe may be greater than the lattice constant for Si. Dopants may be added during epitaxy to form a semiconductor of a desired conductivity type in the source and drain regions. As the SiGe grows during epitaxy, it tends to exert a force on the adjacent Si due to the lattice mismatch, and the exerted force results in compressive stress of Si in the pFETs channel region. This compressive stress results in an enhanced mobility of holes in the channel region.

Other combinations of materials may be used to form compressive stress in the channel region, as will be evident to those skilled in the art. The invention is not limited to only Si substrates and epitaxially-grown SiGe source and drain regions.

Patterning features with dimensions of 50 nm or less, such as the gate structures 110, 208 shown in FIG. 2A, imposes significant challenges for photolithography. One approach to achieving such high resolution and dense packing is to pattern multiple gates on a regular spacing, e.g., similar to patterning a diffraction grating, rather than patterning isolated gates or gates at random spacings. As a result, some of the gate structures (dummy gates 208) may not be used. For example, some of the dummy gates may be patterned over STI structures 220.

However, these dummy gates may still provide a useful role in controlling the epitaxial growth in the source and drain regions for active pFETs.

Figure 2B:
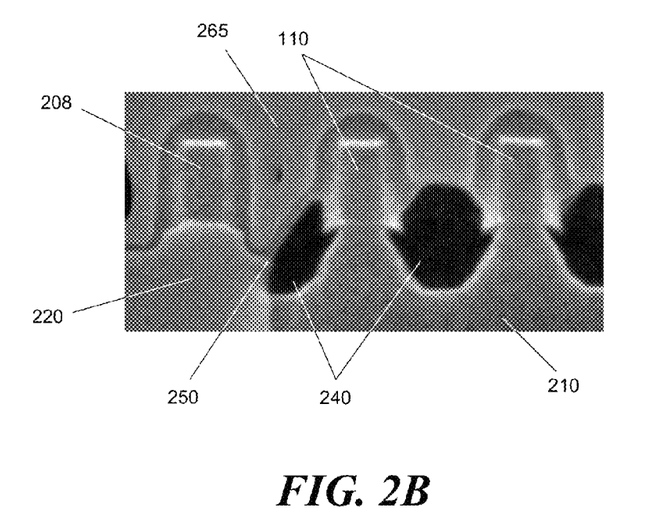
FIG. 2B is a scanning-electron micrograph showing epitaxially-grown source and drain regions and faceting at an undesirable location.

One problem discovered when fabricating the devices illustrated in FIG. 2A is shown in the scanning electron micrograph of FIG. 2B. The micrograph shows a magnified cross section of a wafer that includes two gates 110 and a dummy gate 208. The width of each gate is about 30 nm. The dark regions represent the epitaxially-grown material 240, which is SiGe for the devices shown. Beneath the dummy gate 208 is an STI structure 220.

A problem discovered when fabricating the short-channel, enhanced-mobility pFETs is visible in the left-most epitaxial deposition in the micrograph. In this region, part of the STI material adjacent the dummy gate 208 has been undesirably etched back below the level of the channels in the adjacent pFET devices. The etch back results in a "free-space point" 250 of the STI material below the level of the channels. During subsequent epitaxial growth of source and drain materials, the free-space point initiates a faceting of the epitaxial material 240 in an undesirable location, such that a surface forms on the epitaxially-grown material projecting up and towards the adjacent gate 110. As a result, there is significantly less epitaxially-grown material 240 on one side (e.g., source region) of the gate 110 as compared with epitaxially-grown material 240 on the other side (e.g., drain region) of the gate.

The faceting of the epitaxially-grown material 240 in an undesirable location can have at least two adverse effects in the fabrication of the pFETs. One adverse effect is that the compressive stress in the channel region under the adjacent gate may differ from values for other gates on the wafer. Thus, carrier mobility and device performance may undesirably differ from other pFETs on the wafer or chip.

A second adverse effect relates to a subsequent formation of conductive contacts to the source and drain regions. In a subsequent etch that may be used to open vias to the source and drain regions, the etch may not reach through to the epitaxially-grown material 240 where faceting occurs at an undesirably location. For example, there may be a cover layer 265 (e.g., a passivating material) over the gates, source, and drain regions. For the source or drain region with the undesirable faceting, the cover layer 265 is thicker than at nearby source and drain regions. If the etching of vias in the cover layer 265 stops when the source and drain material between the gates 110 is reached, then the via between the gate 110 and dummy gate 208 will not extend through to the epitaxially-grown material 240. On the other hand, if the etch is continued such that the etch reaches through to the epitaxially-grown material between the gate 110 and dummy gate 208, then the vias between gates 110 may be over-etched which can result in the deposition of contact material too close to pn junctions or gate 110 in the pFETs. If the contact material is too close to pn junctions or gates in a short-channel pFET, the pFET may exhibit higher current leakage than is desired. The current leakage may be leakage occurring when the transistor is nominally in an "off" state (e.g., no inversion layer forming a conductive channel), or may be leakage occurring during operation (e.g., leakage via capacitive coupling).

The process illustrated in FIGS. 3A-3E depicts embodiments of a method for controlling faceting during the fabrication of mobility-enhanced pFETs. Some of the techniques described may be applied to other processes that employ sub-surface epitaxial growth of crystalline material. The process controls the epitaxial growth by utilizing patterned structure in the source and drain regions of the pFETs to constrain the growth. The patterned structure forms enclosures with narrowed openings, somewhat bottle-shaped but at nanometer dimensions. Epitaxial growth occurs within the enclosures and limits the faceting to the opening mouth of the enclosures. In some embodiments, some of the process steps shown or described may be omitted. Additional steps not shown or described may be used in some embodiments that employ sub-surface epitaxial growth.

Figure 3A:
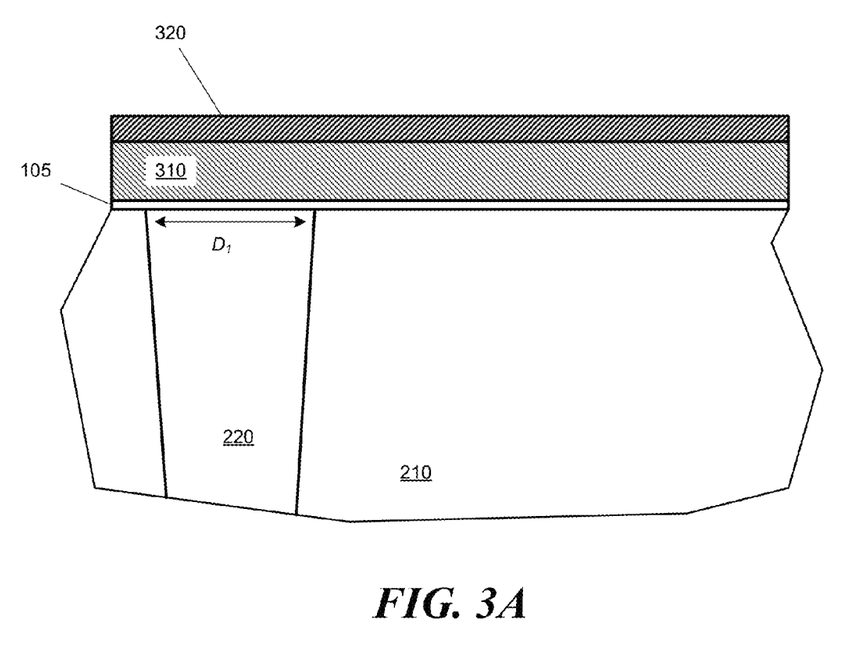
FIGS. 3A-3F depict process steps for forming enhanced-mobility FETs, according to some embodiments.

By way of example, and without intent to limit the method to only the embodiments illustrated, FIG. 3A shows a portion of a processed wafer that may be used to fabricate enhanced-mobility, short-channel pFETs. The wafer may comprise a substrate 210 in which are formed one or more isolation structures 220, e.g., STI structures in this example. The width of the STI structure at the surface of the substrate is represented as $D_1$. A thin gate insulator 105 (e.g., a thin oxide or other dielectric) may be deposited on the wafer and a conductive gate material 310 (e.g., a metal, polycrystalline silicon, or other conductor) may be deposited in a layer over the gate insulator 105. Above the gate material 320 may be a layer of mask material 320. The mask layer material 320 may exhibit etch selectivity over at least the gate material 310, and may be a hard mask material (e.g., an oxide, a nitride, an inorganic composition) or a soft mask material (e.g., a polymeric resist). In some embodiments, the gate insulator 105 may comprise silicon dioxide ($SiO_2$), the gate material may comprise polycrystalline silicon, and the mask layer may comprise $SiO_2$ or silicon nitride ($Si_3N_4$).

The thickness of the gate insulator 105 may be between about 0.5 nm and about 10 nm, in some embodiments. According to some embodiments, the thickness of the gate insulator may be between 0.5 nm and about 5 nm. The thickness of the gate material 310 may be between about 10 nm and about 100 nm, in some embodiments. According to some embodiments, the thickness of the gate material 310 may be between 30 nm and about 70 nm. The thickness of the mask material 320 may be between about 10 nm and about 100 nm, in some embodiments. According to some embodiments, the thickness of the mask material 320 may be between 20 nm and about 50 nm.

Figure 3B:
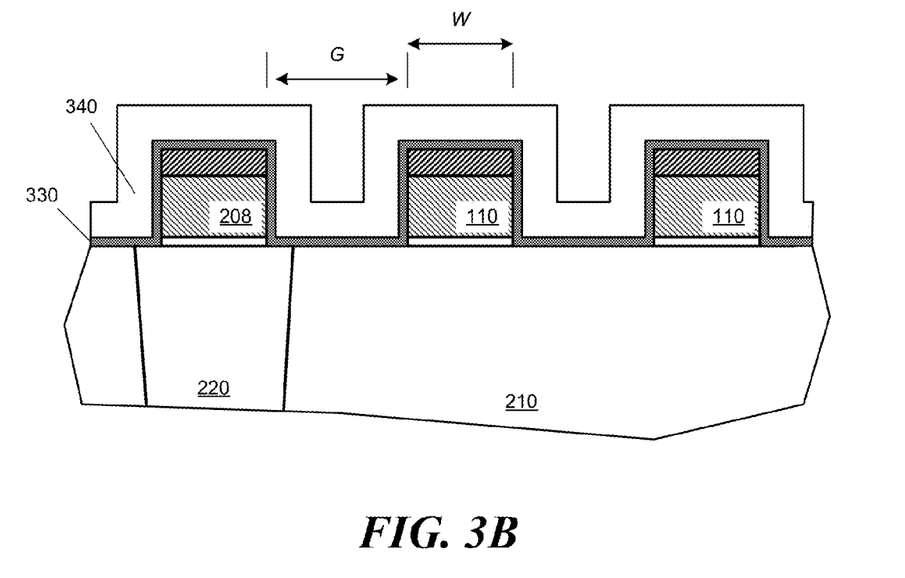

The layer of mask material 320 may be patterned and etched using photolithography techniques to form gates 110 and dummy gates 208, as depicted in FIG. 3B. The patterning and etching may comprise several steps, e.g., photopatterning and development of a resist layer deposited over the mask layer 320 to obtain a pattern for the gates and dummy gates in the resist layer. This may be followed by selective etching of the mask layer material 320, selective etching of the gate layer material 310, and selective etching of the gate insulator 105, so as to transfer the pattern in the resist to the underlying layers. The selective etching may be carried out using any suitable anisotropic etching technique, e.g., reactive-ion etching (RIE) with appropriately selected etchant gases.

The dimensions of the widths W of the gates and dummy gates may be approximately equal and less than approximately 75 nm in some embodiments, less than approximately 50 nm in some embodiments, less than approximately 40 nm in some embodiments, less than approximately 30 nm in some embodiments, and yet less than approximately 20 nm in some embodiments. The space or gap G between the gates 110 and dummy gates may be approximately equal and less than approximately 75 nm in some embodiments, less than approximately 50 nm in some embodiments, less than approximately 40 nm in some embodiments, less than approximately 30 nm in some embodiments, and yet less than approximately 20 nm in some embodiments. The gaps G may be approximately equal to the widths W in some embodiments, may be greater than the widths W in some embodiments, or may be less than the widths W in some embodiments. The gates 110, 208 may be regularly spaced in an array, and a pitch or period of the array may be less than about 100 nm in some embodiments. In some implementations, the pitch of the array may be approximately 85 nm.

A layer 330 of material, e.g., an etch-stop layer, may be deposited over the gates 110 and dummy gates 208. The etch-stop layer 330 may exhibit etch selectivity over the substrate 210, and over a subsequently deposited spacer material 340. The etch-stop layer may be an electrical insulator and comprise a nitride layer, e.g., a $Si_3N_4$ layer, and may be between about 5 nm thick and about 20 nm thick. The spacer material 340 may be an oxide, e.g., $SiO_2$, and may be between about 5 nm thick and about 50 nm thick. In some embodiments, the etch-stop layer is approximately 5 nm thick and the spacer material is approximately 20 nm thick.

Figure 3C:
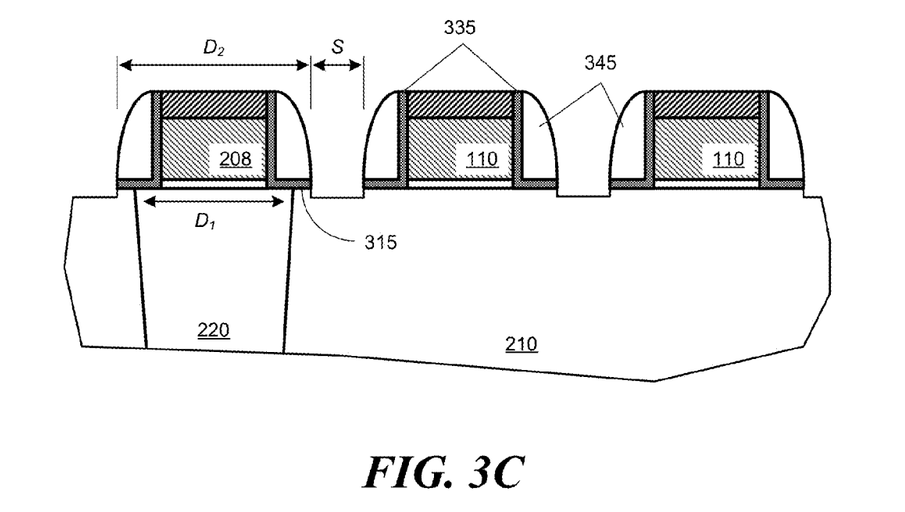

Referring to FIG. 3C, after deposition of the spacer material 340, the wafer may be etched using an anisotropic etching process to etch back the spacer material and layer 330 and to expose source and drain regions of the substrate 210. In this process, a blanket etch may be used to etch back the spacer material to expose the etch-stop material 330 above source and drain regions (not yet formed) adjacent the gates 110. According to some embodiments, an etch mask may be patterned, so that the vias of width S are formed by a masked etch. After etching through the spacer material 340, the exposed etch-stop material 330 may be etched to expose the underlying substrate 210 in the source and drain regions. The etch through the etch-stop material 330 may remove all the etch-stop material in the exposed regions, leaving L-shaped portions 335 of the etch-stop material and shoulders 345 of the spacer material adjacent the gates and dummy gates. A resulting profile is depicted in FIG. 3C. The L-shaped portions 335 and/or shoulders 345 comprise spacer structures adjacent to the gates. A same continued etch or a subsequent different etch may be used to etch into the substrate 210 by a small amount (e.g., less than about 10 nm) at the source and drain regions. According to some embodiments, the etch into the substrate may be between about 3 nm and about 5 nm.

When etching through the spacer material 340 and/or the etch-stop material 330, end-point detection may be used. For example, when etching through the etch-stop material 330, the plasma power and/or bias or emission spectra from the plasma may be monitored to detect break-through of the etch-stop material.

In various embodiments, dimensions and/or spacings of gate structures 208, 110 and the isolation structures 220 are selected such that edges of the isolation structures are protected completely by at least one dummy gate 208 and adjacent L-shaped portions 335 and shoulders 345. For example, the STI structure 220 does not extend laterally beyond the L-shaped portions 335. Alternatively, an edge of an STI structure 220 does not end up in an exposed source or drain region. For an edge of the STI structure to be protected, a lateral dimension $D_1$ of the STI structure may be any value within the following ranges:

$$D_1 < D_2; \text{ or} \tag{1}$$

$$nP \leq D_1 < nP + D_2 \tag{2}$$

where n is an integer greater than 0, and P represents the pitch or period (e.g., $P = D_2 + S$) of the gate structures (assuming the gate structures are patterned on a regular spatial periodicity). The edges of an STI structure may be protected by one gate (according to EQ. 1) or by two gates spaced apart by nP (according to EQ. 2). There may be an overhang 315 of the L-shaped portions beyond the edges of the STI structures 220.

The overhang 315 may be sized to allow for some misalignment between the gates and STI structures. In some embodiments, the overhang 315 may be between about 3 nm and about 12 nm. By protecting the edges of the STI structures with one or more dummy gates 208, etch back and/or formation of a free-space point of the STI material in an adjacent source or drain region can be prevented.

Protecting the edges of the STI structures by using more than one dummy gate 208 can result in wasted device or Si area. Instead, it is preferable to protect edges of each STI region with a single dummy gate structure. Because design and patterning rules place limits on the dimensions of the STI structures, the STI structures have a minimum printable width $D_1$. Since the STI structure has a minimum width, the width of the dummy gate may be sized accordingly in order to protect the edges of the STI regions. However, in some implementations the gate structures are patterned simultaneously using a regular periodic pattern, and the dimensions of a single gate structure cannot be varied without varying the dimensions of all other gate structures and the spacings between and pitch P of the gate structures. The spacings between gate structures affect a distance between an active area of a transistor and the STI region. Increasing spacing therefore reduces transistor density, which is undesirable.

To maintain higher transistor density and avoid a need for excessively increasing the width of the dummy gates 208, enlarged L-shaped portions 335 may be formed during spacer etching. These enlarged L-shaped features provide protection of the STI edges, and can prevent formation of free-space points at the STI structures. In some embodiments, the L-shaped portions and spacers are between 20% and 50% larger than might normally be used for a transistor. In some embodiments, the L-shaped portions and spacers are between 50% and 100% larger than normally used for a transistor. In some embodiments, the L-shaped portions and spacers may be more than 100% larger than normally used.

Factors that influence the lateral dimensions of the L-shaped portions 335 (e.g., a dimension of the foot of the L) include target dimension of the STI structures, process-related dispersion of the STI dimensions, target dimensions of the gates 110 and dummy gates 208, process-related dispersion of the gate dimensions, and overlay accuracy associated with patterning the gates over the STI structures. In some embodiments, process-related dispersion of dimensions may be between about 5% and 20%. Overlay accuracy in some systems can be less than 10 nm. A lateral dimension of the L-shaped portions 335 may be derived by considering a worst-case condition, e.g., largest STI dimension, narrowest gate, and maximal overlay error.

As one example of determining a lateral dimension of the L-shaped portions 335, a design may call for a 50-nm-wide STI structure 220 and a 30-nm-wide gate. The fabrication process may exhibit a 10% process-related dispersion of printed features and be capable of an overlay accuracy of 8 nm at 3σ. If the patterning were ideal (no printing or alignment errors), then a lateral dimension of the L-shaped portion of about 10-12 nm would assure protection of the edges of the STI structures. Factoring in printing and alignment errors, the lateral dimension of the L-shaped portion is increased to about 22-24 nm to provide protection of the edges of the STI structures to accommodate substantially all patterning errors.

Figure 3D:
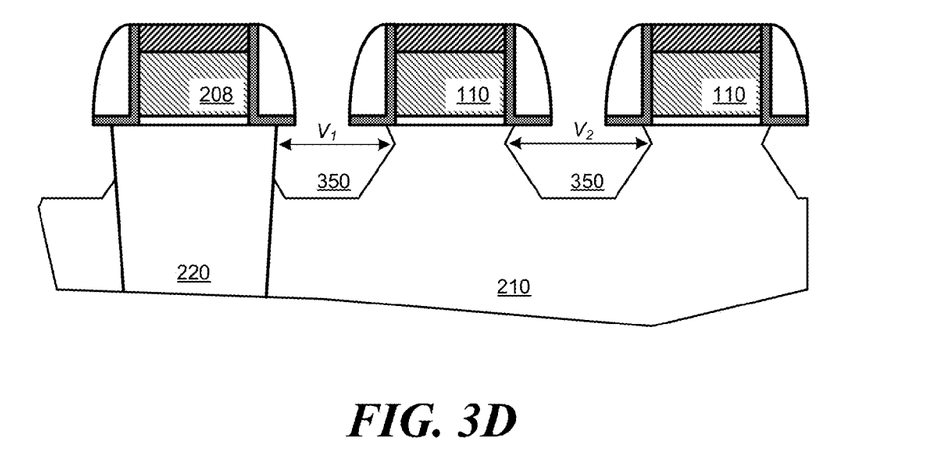

After exposing source and drain regions adjacent the gates 110 and dummy gates 208, a subsequent etch of the substrate 210 may be used to open voids 350, as depicted in FIG. 3D. The etch may be a plasma etch process, e.g., at higher pressures and low bias, or may be a wet etch process. In some embodiments, the etching to open voids 350 may comprise a combination of an anisotropic plasma etch and an isotropic wet etch. For example, an anisotropic or semi-isotropic plasma etch may first be used, and a second wet etch may be used to extend the lateral direction of the etch. According to some embodiments, the wet etch may be a selective etch that preferentially etches along a crystal plane of the substrate 210. For example, the wet etch may comprise an ammonium hydroxide ($NH_4OH$) etch of a silicon substrate. In various embodiments, the etchant for the substrate 210 minimally etches the etch-stop material 330. The etch selectivity over the etch-stop material 330 may be greater than about 4:1 in some embodiments, and greater than about 8:1 in some embodiments.

The isotropic etching may be carried out until the lateral etching extent reaches to approximately the edges of the gates 110, as depicted in FIG. 3D. For example, the lateral etch may be stopped when the edge of the voids 350 are within about plus or minus 5 nm of the edges of the gates 110. In some embodiments, the lateral etch may be stopped when the edge of the voids 350 are within about plus or minus 10 nm of the edges of the gates 110. Since the STI structures 220 may not be appreciably etched by the Si etchant, the etch may stop at the STI structure interface. The isotropic etch may be a timed etch.

The resulting structures at the surface of the wafer comprise small (nanometer-scale) enclosures having a constricted opening between the gates, as depicted in FIG. 3D. In cross-section, the partially-enclosed voids have contours resembling an inside of a bottle or container having a long neck. On a wafer, the partially-enclosed voids 350 may be in the form of semi-enclosed trenches extending along the wafer's surface. A width S of an opening into the voids may be less than a maximum transverse dimension $V_1$ or $V_2$ of the void. The constricted opening may be defined by the spacer structures, and be at approximately the level of the channel or gate insulator, e.g., within about 20 nm of the level of the channel, within about 10 nm of the level of the channel. In some embodiments, the gates and voids may be patterned in grid, triangular, hexagonal arrays, or other forms of arrays, so that the voids more closely resemble an inside of a bottle.

Some of the voids 350 are bounded nearly completely by material of the substrate 210, and some of the voids may extend to trench isolation structures 220. For example, and for some voids, a portion of a surface of a partially-enclosed void may comprise a surface of a trench isolation structure. At the STI structure 220, it edges are protected by an overlying spacer structure that includes L-shaped portions 335.

According to some embodiments, the edges of trench isolation structures 220 are located such that transverse width $V_1$ of a void extending to a trench isolation structure is approximately equal to a transverse width $V_2$ of a void formed nearly completely within the substrate 210. The two transverse widths $V_1$ and $V_2$ may be equal to within about 20 nm in some embodiments, and within about 10 nm in some embodiments.

In various embodiments, the interior of a void 350 may have no significant inward projections from the substrate 210 or trench isolation structure 220 at or below the level of the channel region. For example, the interior surfaces may be concave or substantially flat, and free of inward projections that would initiate faceting in a subsequent epitaxial filling step. Any inward projections on the surface of the void would not exhibit a reflex angle greater than about 180 degrees is some embodiment, or greater than about 190 degrees in some embodiments.

The wafer may be prepared for epitaxial growth of semiconductor material in the voids 350 following the etching of the voids. In some embodiments, the wafer may be subjected to a cleaning process to remove any residue that may remain from the previous etching step or steps.

Figure 3E:
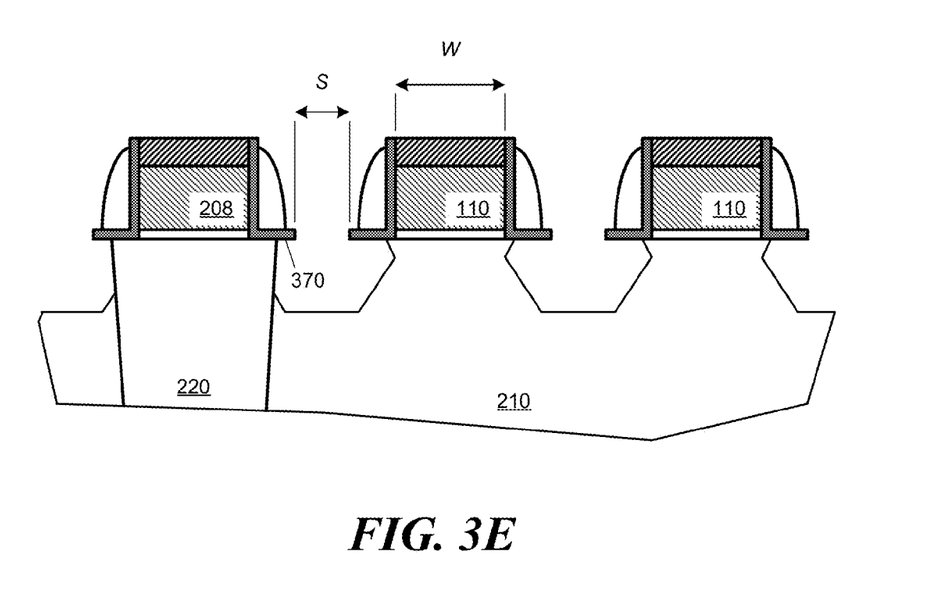

In some embodiments, after formation of the voids 350, the wafer may be placed in a cluster tool that includes an epitaxial tool and a plasma etching tool. The tools may be joined by vacuum interlocks, so that a wafer remains under a vacuum environment when moving from the plasma etching tool to the epitaxial tool. The wafer may first be etched lightly to remove any native oxide on the exposed surfaces of the semiconductor substrate 210, e.g., on the surfaces in the source and drain regions. The etch may comprise a SiCoNi reactive-ion etch that removes any native oxide from the substrate, and also slightly etches back the shoulders 345 on the L-shaped portions 335. A resulting structure is depicted in FIG. 3E. The etch-back of the shoulders beneficially widens the opening through the spacer material 340 to the voids 350 to improve transport of ions to and from the substrate during epitaxial growth. In this regard, at least a portion of the spacer structure (e.g., a portion of the shoulder) that protects an underlying edge of an STI structure is disposable and is removed during the overall transistor fabrication process. Since the L-shaped portion 335 does not readily etch, it remains and provides protection of the edges of the STI structure for a subsequent epitaxial growth of the source and drain regions.

After the etching, the wafer may be transferred to an epitaxy chamber under vacuum and/or in an oxygen-depleted environment so as to prevent oxidation at the exposed surfaces of the substrate 210. Epitaxial growth to form doped semiconductor in the source and drain regions may then be carried out. For example, SiGe may be epitaxially grown in the voids 350 with a dopant so that p-type source and drain regions are formed. Because of a lattice mismatch between the SiGe and semiconductor of the substrate 210, the SiGe source and drain regions may compressively stress the channel regions of the pFETs.

Figure 3F:
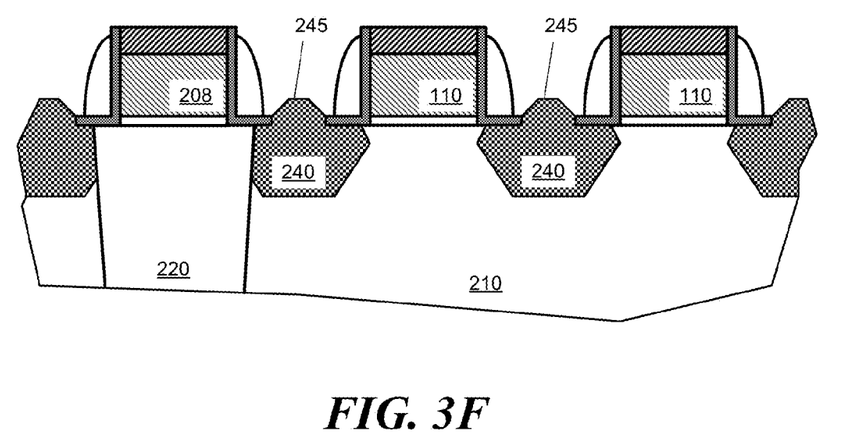

In some embodiments, the epitaxial growth substantially fills the voids 350 in the substrate 210, e.g., up to approximately the bottom of the L-shaped portion 335. In some implementations, the epitaxial growth continues past the bottom of the L-shaped portion and into the gap between the gates, as depicted in FIG. 3F. As may be appreciated from the drawing, the overhang of the L-shaped portion 335 above the STI structure 220 prevents formation of a free-space point of the STI material at or below the level of the channel, and therefore prevents faceting of the epitaxial material 240 in an unwanted or undesirable location in the source or drain regions. As may be appreciated from the drawing of FIG. 3F, the amount and height of epitaxially-grown material 240 in the source and drain regions may exhibit improved uniformity across the wafer and in regions adjacent the STI structures 220. (Compare with the structure shown in FIG. 2B, for example.) According to some embodiments, the epitaxial growth of material in the source and drain regions continues past the gate insulator level by any value up to about 20 nm. The top surfaces 245 of the epitaxially-grown material 240 between the gates may be of uniform height across a region of the wafer to less than about ±10 nm in some embodiments, less than about ±5 nm in some embodiments, and even less than about ±2 nm in some embodiments.

Following epitaxial growth of material in the source and drain regions, the spacer material 340 may be stripped, and a passivation layer deposited. Vias may be opened in the passivation layer, and contacts to source, gate, and drain regions formed.

Figure 3G:
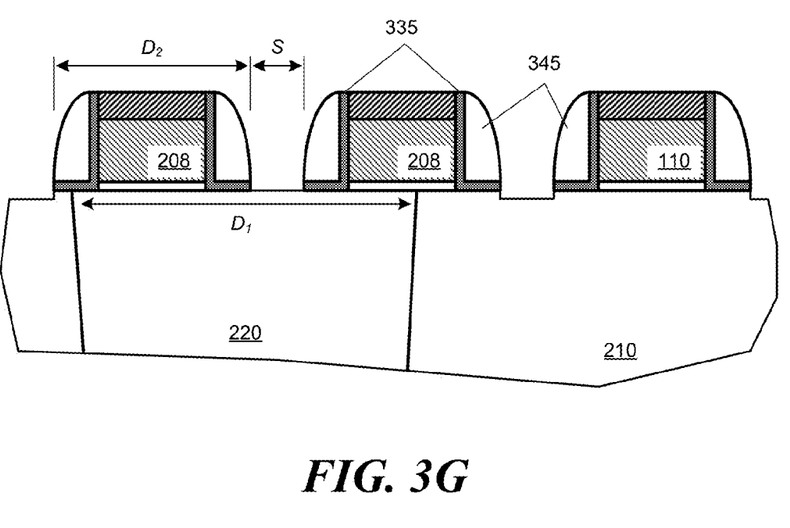
FIG. 3G illustrates an embodiment in which a trench isolation structure spans a distance $D_1$ between two gates.

FIG. 3G illustrates an embodiment in which a trench isolation structure 220 may span a distance greater than the width of a single gate and its adjacent spacer structures. For example, a trench isolation structure may span a distance given by EQ. 2 above. For the embodiment illustrated, n=1. There are some advantages in having the trench isolation structures 220 span distances $D_1$ greater than the width of a single gate and its adjacent spacer structures. For example, the larger trench isolation structure will generally be easier to pattern. Additionally, misalignment tolerance, between the trench isolation structures and gates, can be greatly improved as compared to the embodiment shown in FIG. 3C. A disadvantage is the loss of potentially active pFETs.

Although the technology has been described with regard to enhanced-mobility pFET devices, the process steps may be used to form pFETs that do not exhibit enhanced mobility. For example, epitaxial growth of the source and drain regions may use doped semiconductor material that does not have a lattice mismatch with the substrate and that does not compressively stress the channel region of the pFET. Some of the process steps may be used for forming nFET devices that do not exhibit enhanced mobility.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A transistor, comprising:
a gate structure formed on a substrate;
a first region of the substrate filled with epitaxially-grown material on a first side of the gate structure;
a second region of the substrate filled with the epitaxially-grown material on a second side of the gate, structure;
a trench isolation region adjacent the first region; and
a dummy gate structure for on top of the trench isolation region, the dummy gate structure being wider than the trench isolation region, the dummy gate structure overlying at least a portion of the first region.

2. The transistor of claim 1, wherein the dummy gate structure includes an L-shaped portion of a sidewall spacer adjacent an edge of the trench isolation structure and extending over at least part of the trench isolation structure and at least part of the epitaxially-grown material.

3. The transistor of claim 2, wherein there is no faceted growth of the epitaxially-grown material at a junction of the epitaxially-grown material, trench isolation structure, and L-shaped portion.

4. The transistor of claim 1, wherein the first region or second region comprises a drain region of the transistor.

5. The transistor of claim 1, wherein the first region filled with epitaxially-grown material extends above the level of the channel.

6. The transistor of claim 1, wherein the substrate comprises a first semiconductor material having a first conductivity and the epitaxially-grown material comprises a second semiconductor material having a second conductivity.

7. The transistor of claim 1, wherein the substrate comprises silicon and the epitaxially-grown material comprises silicon-germanium.

8. The transistor of claim 1, wherein the substrate comprises a first crystalline semiconductor characterized by a first lattice constant and the epitaxially-grown material comprises a second crystalline semiconductor characterized by a second lattice constant that is different from the first lattice constant.

9. The transistor of claim 1, wherein the epitaxially-grown material compressively stresses the substrate at the level of the channel of the transistor.

10. The transistor of claim 1, wherein the gate structure includes an insulated sate having a gate width less than approximately 50 nm.

11. The transistor of claim 1, wherein the gate structure includes an insulated gate having a gate width of approximately 30 nm.

12. The transistor of claim 1 wherein the gate structure and the dummy gate structure include sidewall spacers.

13. The transistor of claim 12, wherein the sidewall spacers comprise an L-shaped layer.

14. The transistor of claim 1, further comprising epitaxially-filled regions adjacent to at least some of a plurality of insulated gates, wherein the plurality of insulated gates are distributed in a regularly-spaced array.

15. The transistor of claim 14, wherein a pitch of the regularly-spaced array of insulated gates is less than 100 nm.

16. A method for making a transistor, the method comprising forming a dummy gate structure over an isolation region, the dummy gate structure being wider than the isolation region, partially-enclosed void in a substrate adjacent a channel region of the transistor, wherein the partially-enclosed void has an opening at approximately a level of the channel region and wherein the opening has a width that is less than a maximum transverse dimension of the void.

17. The method of claim 16, further comprising epitaxially growing semiconductor material in the partially-enclosed void.

18. The method of claim 17 wherein the epitaxially-grown semiconductor compressively stresses the substrate in the channel region of the transistor.

19. The method of claim 17 further comprising:
forming a plurality of partially-enclosed voids in the substrate; and
epitaxially growing semiconductor material to fill the plurality of partially-enclosed voids.

20. The method of claim 19, wherein at least two of the voids filled with epitaxially-grown material comprise source and drain regions of a field-effect transistor and are spaced less than 50 nm apart.

21. The method of claim 19, wherein the plurality of partially-enclosed voids are formed adjacent to insulated gates that are regularly spaced in an array.

22. The method of claim 16, further comprising epitaxially growing semiconductor material in the partially-enclosed void to a level above the channel region.

23. The method of claim 16, wherein a portion the partially-enclosed void extends to a surface of a trench isolation structure.

24. The method of claim 16, wherein a portion of a surface of the partially-enclosed void comprises a surface of a sidewall spacer that is adjacent to a gate of the transistor.

25. The method of claim 16, wherein the opening is defined by sidewall spacers that are adjacent to gate structures.

26. The method of claim 16, wherein the forming the partially-enclosed voids comprises:
forming insulated gates on a surface of the substrate;
forming sidewall spacers adjacent the insulated gates; and
isotropically etching the substrate in regions between the sidewall spacers.

27. The method of claim 26, wherein a width of the insulated gates is less than 50 nm.

28. The method of claim 26, wherein the sidewall spacers comprise L-shaped portions.

29. The method of claim 28, wherein the L-shaped portions define the opening to the partially-enclosed void.

30. The method of claim 28, further comprising selecting a lateral dimension of the L-shaped portions so as to protect an edge of an underlying trench isolation structure.

31. The method of claim 26 wherein forming the insulated gates and adjacent sidewall spacers comprises forming at least one insulated gate and adjacent sidewall spacers over a trench isolation structure.

32. The method of claim 30, wherein the insulated gate and adjacent sidewall spacers cover one or both edges of the trench isolation structure.

33. A method of epitaxially filling a void in a semiconductor substrate, the method comprising:
forming the void as a partially-enclosed void comprising an opening to the void that has a width less than a maximum transverse dimension of the void; and
epitaxially growing material in the void to fill the void to at least the opening,
wherein
the interior surface of the void has no significant inward projections from which faceting of the epitaxially-grown material would occur; and
the opening to the void is formed by a dummy spacer on top of a trench isolation region, the dummy spacer extending beyond an edge of the trench isolation region to overlie at least a portion of the epitaxially grown material.

34. The method of claim 33, wherein the semiconductor substrate and the epitaxially-grown material are crystalline semiconductors.

35. The method of claim 33, wherein the semiconductor substrate and the epitaxially-grown material are crystalline semiconductors of different conductivity type.

36. The method of claim 33, wherein the semiconductor substrate and the epitaxially-grown material are crystalline semiconductors having different lattice constants.

37. The method of claim 33, wherein the forming the void as a partially-enclosed void comprises:
depositing a first layer on the semiconductor substrate;
etching the opening through the first layer; and
isotropically etching the void through the opening.

38. The method of claim 33, wherein the partially-enclosed void is formed at a source or drain region of a transistor.

39. The method of claim 38, wherein the first layer comprises a layer of a sidewall spacer for a transistor gate.

40. The method of claim 33, wherein a portion of a surface of the partially-enclosed void comprises a surface of a trench isolation structure.

41. The method of claim 33, wherein:
the forming further comprises forming a plurality of partially-enclosed voids; and
the epitaxially growing further comprises epitaxially growing material in the plurality of partially-enclosed voids.

42. The method of claim 41, wherein at least two of the partially-enclosed voids are spaced apart less than 50 nm.

43. The method of claim 41, wherein at least two of the partially-enclosed voids that are filled with the epitaxially-grown material comprise source and drain regions of a field-effect transistor.

44. The method of claim 41, wherein the plurality of partially-enclosed voids are regularly spaced in an array.

* * * * *

UNITED STATES PATENT AND TRADEMARK OFFICE
CERTIFICATE OF CORRECTION

| | | |
|---|---|---|
| PATENT NO. | : 8,987,827 B2 | Page 1 of 1 |
| APPLICATION NO. | : 13/907690 | |
| DATED | : March 24, 2015 | |
| INVENTOR(S) | : Pietro Montanini et al. | |

It is certified that error appears in the above-identified patent and that said Letters Patent is hereby corrected as shown below:

In the Claims:

Column 10, Line 46:
"grown material on a second side of the gate, structure;" should read, --grown material on a second side of the gate structure;--.

Column 10, Line 48:
"a dummy gate structure for on top of the trench isolation" should read, --a dummy gate structure formed on top of the trench isolation--.

Signed and Sealed this
Twenty-ninth Day of March, 2016

Michelle K. Lee
*Director of the United States Patent and Trademark Office*